United States Patent [19]
Wells et al.

[11] Patent Number: 5,301,151
[45] Date of Patent: Apr. 5, 1994

[54] HIGH VOLTAGE LEVEL CONVERTER

[75] Inventors: Steve Wells, Citrus Heights; Alan Baker, Fair Oaks, both of Calif.

[73] Assignee: Intel Corporation, Santa Clara, Calif.

[21] Appl. No.: 77,326

[22] Filed: Jun. 15, 1993

Related U.S. Application Data

[63] Continuation of Ser. No. 696,583, May 7, 1991, abandoned.

[51] Int. Cl.$^5$ ............................................. G11C 7/00
[52] U.S. Cl. .......................... 305/189.09; 365/189.11; 365/222
[58] Field of Search .................. 365/189.09, 189.11, 365/226

[56] References Cited

U.S. PATENT DOCUMENTS 4,787,066 11/1988 Leuschner ...................... 365/189.11
4,975,883 12/1990 Baker et al. ..................... 365/226

Primary Examiner—James B. Mullins
Attorney, Agent, or Firm—Blakely, Sokoloff, Taylor & Zafman

[57] ABSTRACT

Circuitry for locking out a first signal generated from a first power supply while the first power supply is at or below a first voltage level is described for a non-volatile semiconductor memory. The circuitry includes a first P-type transistor P1 having a gate, a drain, and a source. The source of P1 is coupled to a second power supply, the drain of P1 is coupled to a first node and the gate of P1 is coupled to a second node. The second node provides an output signal representative of the first control signal. The circuitry also includes a first N-type transistor N1, having a gate, a drain, and a source. The drain of N1 is coupled to the first node, the source of N1 is coupled to a third, and the gate of N1 is coupled to the first control signal and to a fourth node. Included is a second N-type transistor N2, having a drain, a source and a gate. The gate of N2 is coupled a sixth node. The drain of N2 is coupled to the second node and the source of N2 is coupled to the third node. A second P-type transistor is included in the circuitry and also has a gate, a drain and a source. The source of P2 is coupled to the second power supply, the gate of P2 is coupled to the first node and a drain of P2 is coupled to second node. Also included in this circuitry is a third N-type transistor N3 having a gate, a drain, and a source. The drain of the N3 transistor is coupled to the first node, the source of N3 is coupled to the third node and the gate of N3 is coupled to a fifth node. The circuitry includes apparatus for preventing transistor N2 from driving the second node when the first power supply is below the first voltage level. The output of the apparatus is coupled to the gate of N2. The apparatus inputs are coupled to the first control signal and a second control signal representative of the voltage level of said first power supply.

18 Claims, 4 Drawing Sheets

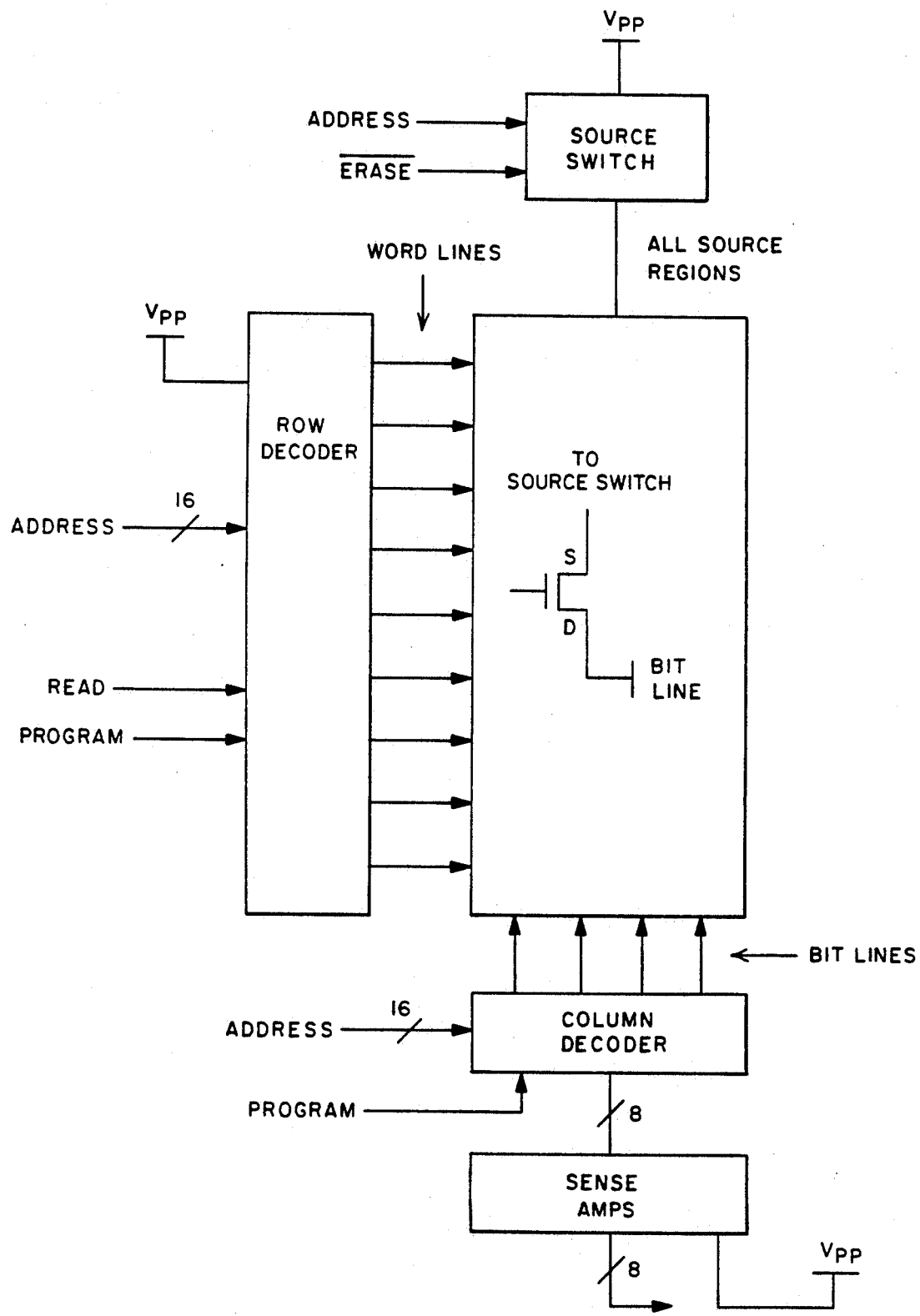
FIG_1

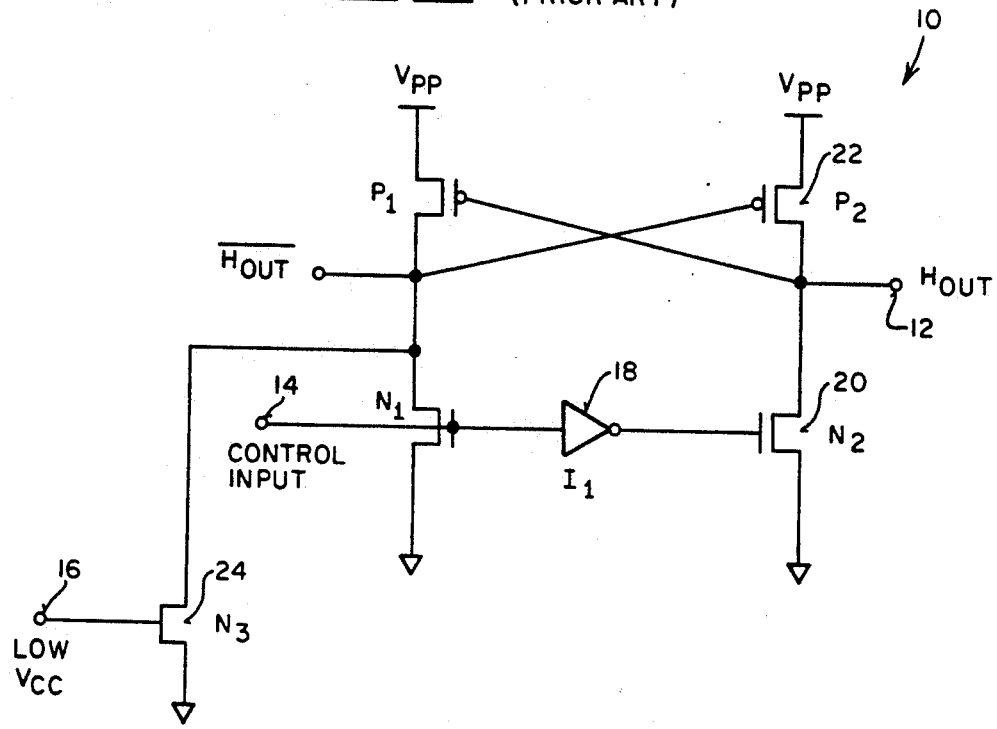
FIG_2 (PRIOR ART)
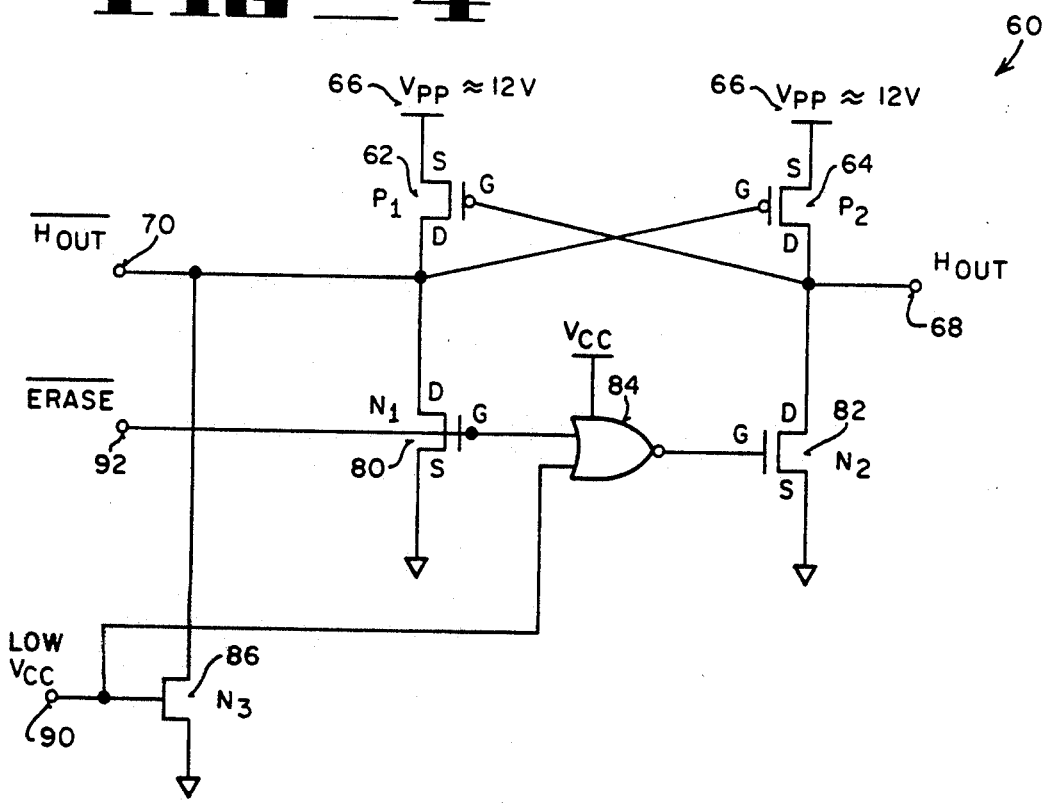
FIG_4

FIG_3A
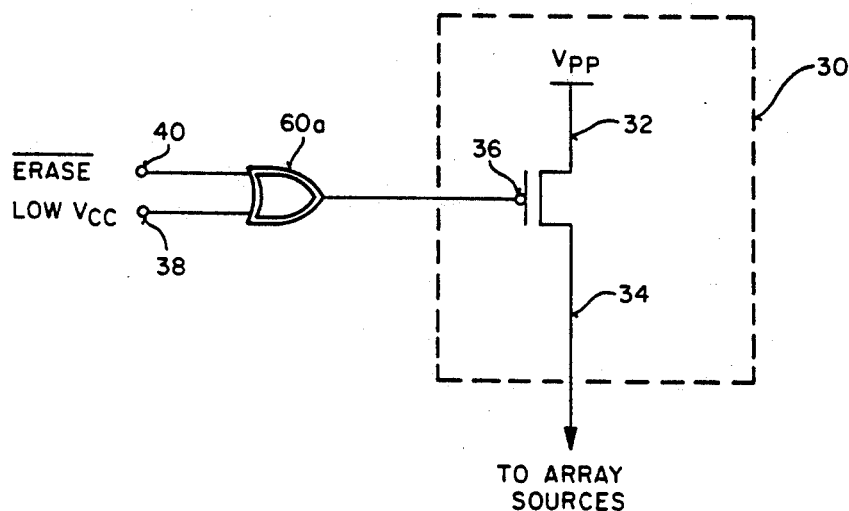
FIG_3B
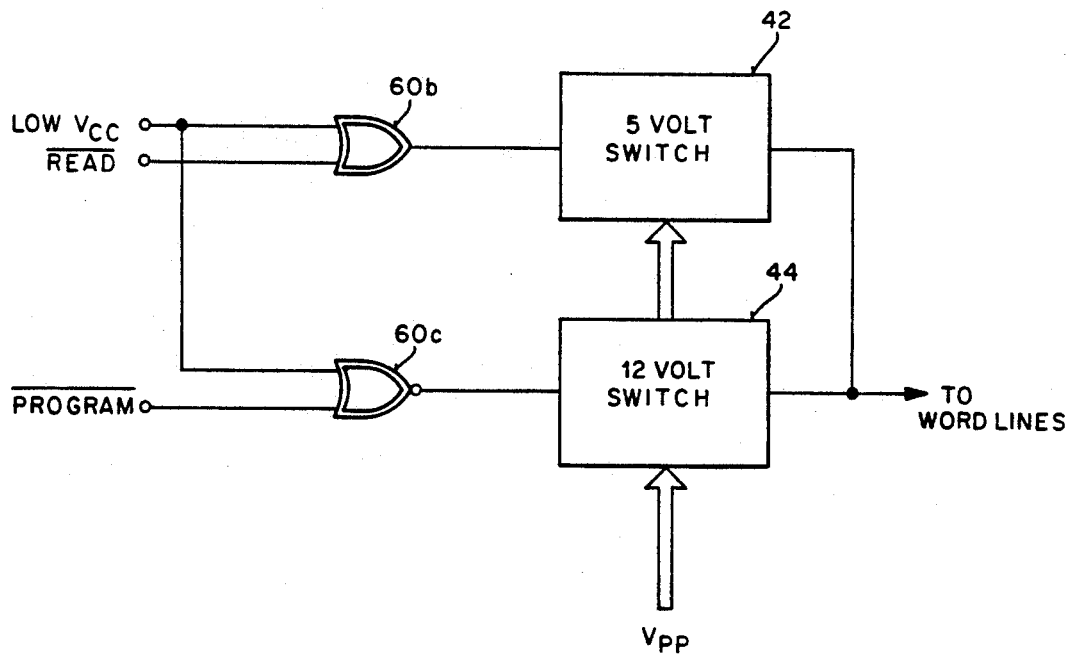

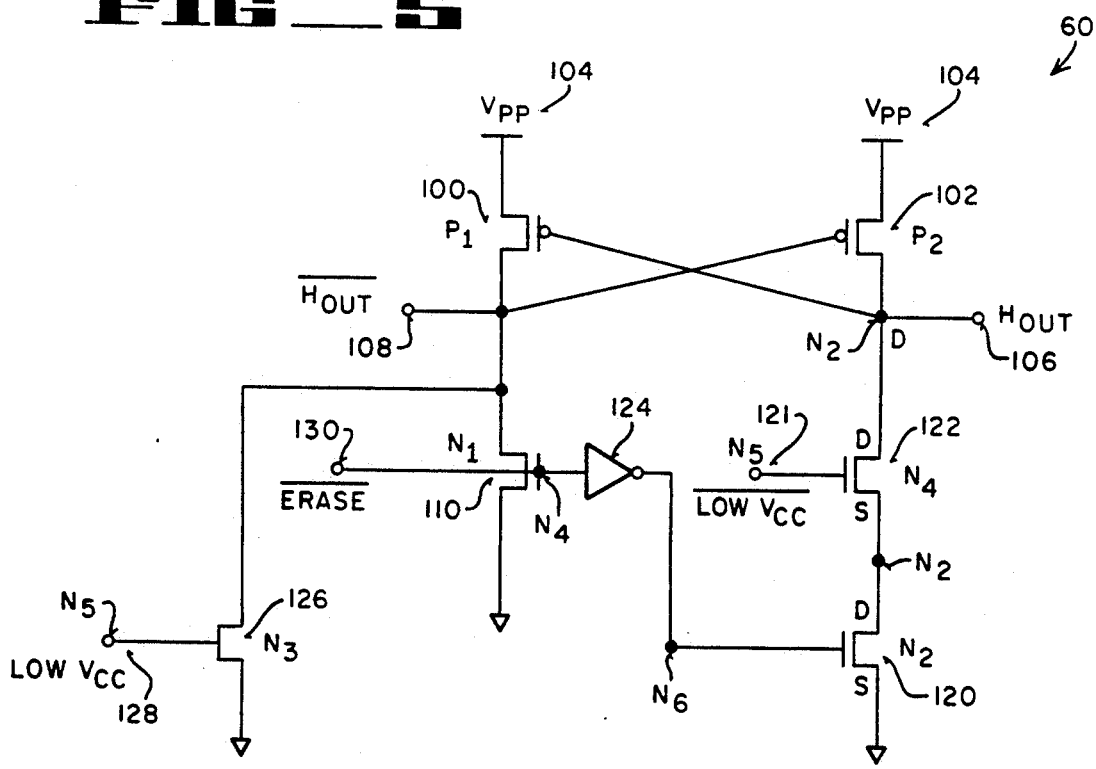
FIG_5

HIGH VOLTAGE LEVEL CONVERTER

This is a continuation of application Ser. No. 07/696,583 filed May 7, 1991, and now abandoned.

FIELD OF THE INVENTION

The present invention pertains to the field of non-volatile semiconductor memories. More particularly, the present invention relates to a high voltage level converter for preventing the accidental programming or erasure of electrically erasable memory cells during power-up and power, down.

BACKGROUND OF THE INVENTION

FIG. 1 depicts the architecture of a non-volatile semiconductor memory array. The array of electrically erasable memory cells is composed of transistors formed by the intersection of word lines and bit lines. The drain terminals of the memory cells are coupled to the bit lines. The control gates extend across the array and are coupled to the word lines. Programming, erasure and reading of flash memory cells is accomplished by the proper application of voltage levels to cell gates, drain and sources. For example, programming a memory cell requires the application of 7 volts to the bit line, 12 volts to the word line, and 0 volts to the cell source. Erasure requires the application of 12 volts to the cell source while the cell drain and gate are allowed to float. Finally, a memory cell's contents may be read by applying 5 volts to both the word and bit lines.

One type of non-volatile semiconductor memory, flash, generally utilizes two power supplies. Vcc is typically a 5 volt supply used to power logic and Vpp is typically a 12 volt supply used to program and erase memory cells.

While the power supplies are at steady state, the application of program and erase voltage levels to memory cells is successfully controlled via logic level control signals; i.e. via control signals generated from Vcc, such as ERASE, PROGRAM and READ. Thus, during steady state operation of power supplies Vcc and Vpp, the integrity of data stored within the non-volatile semiconductor memory is guaranteed. However, the integrity of data stored within a non-volatile semiconductor memory poses a problem when power is first applied, power-up, or removed, power-down. It is possible during power-up or power-down that Vpp will be at 12 volts while Vcc is insufficient to drive the logic generating the program and erase control signals. In this situation, the integrity of memory cell contents cannot be guaranteed.

One prior method of ensuring data integrity during power-up and power-down is power supply sequencing. During power-up, Vcc is allowed to reach steady state before Vpp is applied. Similarly, during power-down Vpp is lowered below some threshold before Vcc is removed or lowered. This prior method is not infallible because it relies upon the memory user to guarantee data integrity.

One prior circuit 10 intended to help provide data integrity during power-up and power-down is shown in FIG. 2. Prior circuit 10 is used in conjunction with the control signals input to the memory array, ERASE, PROGRAM and READ, to protect data stored within the memory array.

A number of conventions are generally followed in FIG. 2. P-type transistors are drawn with a bubble on the gate, N- type transistors without the bubble. Transistors, whether P or N type, are generally drawn with their sources connected to power.

Prior circuit 10 provides an output 12, $H_{out}$, which is used to control the application of program and erase voltages to memory cells. Prior circuit 10 may be used in conjunction with the source switch, row decoder or column decoder shown in FIG. 1. For example, the source switch could be controlled using $H_{out}$, allowing erasure to occur while $H_{out}$ 12 is active at 0 volts and preventing erasure while $H_{out}$ 12 is 12 volts. $H_{out}$ 12 should be 0 volts only when both circuit inputs 14 and 16 are active. Control input 14 is a logic signal generated from the Vcc supply and is active low. In other words, control input 14 allows erasure when it is approximately 0 volts. The second input, LowVcc 16, is an analog signal indicative of the level of the Vcc supply. While Vcc is at or above some desired level, for example 4 volts, LowVcc 16 will be zero volts. So long as LowVcc 16 is zero volts, the level of $H_{out}$ 12 is determined by the control input. When LowVcc 16 rises above zero volts, $H_{out}$ 12 should ideally be approximately 12 volts, thereby preventing the erasure of memory cells.

A more detailed examination of prior circuit 10 reveals that it does not function exactly as desired; i.e., $H_{out}$ 12 may not always be 12 volts while LowVcc 16 is above 0 volts. Consider the operation of prior circuit 10 at a point during power-up or power-down when Vcc is not fully valid. Assume that Vcc=1 volt. Because Vcc is not fully valid, the state of any signal generated using the Vcc supply cannot be guaranteed. Thus, control input 14 may be active logic low. If control input 14 is active, a low will be input to inverter I1 18, which will output some positive voltage level to the gate of transistor N2 20. Transistor N2 20 will conduct, attempting to drive $H_{out}$ 12 to 0 volts. The level of $H_{out}$ 12 cannot be predicted because transistor P2 22 will also be conducting. Zero volts will be applied to the gate of transistor P2 22 because transistor N3 24 will be on while LowVcc 16 is above 0 volts. Because the source of transistor P2 22 is at 12 volts, P2 22 will try to drive $H_{out}$ 12 to 12 volts. With both transistors P2 22 and N2 20 conducting the voltage level of $H_{out}$ 12 could be anywhere between 0 volts and 12 volts. Thus, a circuit using prior circuit 10 for cell source protection would be in danger of accidental erasure of memory contents during power-up and power-down. Further, no data integrity scheme using prior circuit 10 will be foolproof.

SUMMARY OF THE INVENTION

It is an object of the present invention to guarantee the data integrity of a non-volatile semiconductor memory during power-up and power-down.

It is a further object of the present invention to provide a circuit for protecting data integrity that operates equally well for all Vcc voltage levels below steady state.

Circuitry for locking out a first signal generated from a first power supply while the first power supply is at or below a first voltage level is described for a non-volatile semiconductor memory. The circuitry includes a first P-type transistor P1 having a gate, a drain, and a source. The source of P1 is coupled to a second power supply, the drain of P1 is coupled to a first node and the gate of P1 is coupled to a second node. The second node provides an output signal representative of a first control signal. The circuitry also includes a first N-type transistor N1, having a gate, a drain, and a source. The drain of N1 is coupled to the first node, the source of N1 is coupled to a third node, and the gate of N1 is coupled to the first control signal and to a fourth node. Included is a second N-type transistor N2, having a drain, a source and a gate. The drain of N2 is coupled to the second node and the source of N2 is coupled to the third node. The gate of N2 is coupled to a sixth node. A second P-type transistor P2 is included in the circuitry. P2 also has a gate, a drain and a source. The source of P2 is coupled to the second power supply, the gate of P2 is coupled to the first node and a drain of P2 is coupled to second node. Also included in this circuitry is a third N-type transistor N3 having a gate, a drain, and a source. The drain of the N3 transistor is coupled to the first node, the source of N3 is coupled to the third node and the gate of N3 is coupled to a fifth node. The circuitry includes apparatus for preventing transistor N2 from driving the second node when the first power supply is below the first voltage level. The output of the apparatus is coupled to the sixth node. The apparatus inputs are coupled to the first control signal and a second control signal representative of the voltage level of said first power supply.

Other objects, features, and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which references indicate similar elements and in which:

FIG. 1 is a block diagram of a non-volatile semiconductor memory array;

FIG. 2 is a schematic of a prior high voltage level converter;

FIG. 3A is a block diagram of a source protection scheme;

FIG. 3B is a block diagram of a word-line protection scheme;

FIG. 4 is a schematic diagram of one embodiment of a high voltage level converter;

FIG. 5 is a schematic diagram of another embodiment of a high voltage level converter.

DETAILED DESCRIPTION

Together the block diagrams of FIGS. 3A and 3B form a plan for guaranteeing data integrity of a non-volatile semiconductor memory array of the type described in the Background. FIG. 3A depicts circuitry for protecting memory array sources and FIG. 3B illustrates circuitry for word line protection. FIG. 3B could easily be adapted to provide bit line protection. The integrity of data protected by the scheme of FIGS. 3A and 3B ultimately depends upon the infallibility of the high voltage level converters 60a, 60b and 60c, of the present invention, which will be described in more detail below.

The circuitry shown in FIG. 3A includes only that portion of a source switch necessary to illustrate the use of a high voltage level converter 60a to provide cell source protection. During power-up and power-down memory array sources are protected because level converter 60a forces switch 30 open, preventing the application of erase voltage levels.

The source protection circuit includes a high voltage level converter 60a and an erase switch 30. Erase switch 30 is realized as a P-type transistor. Source 32 of erase switch 30 is connected to the programming power supply Vpp, which is typically 12 volts. Drain 34 is coupled to memory array sources. Erasure of the memory array occurs when erase switch 30 is closed, which applies 12 volts to cell sources.

The operation of erase switch 30 is controlled by high voltage level converter 60a. High voltage level converter 60a guarantees data integrity of the memory array by turning erase switch 30 off during power-up and power-down. High voltage level converter 60a turns erase switch 30 off by applying 12 volts to gate 36.

High voltage level converter 60a outputs 12 volts whenever input signal LowVcc 38 is active. The voltage level of LowVcc 38 can range between 4–10 volts when active. Active LowVcc indicates that the output level of logic power supply Vcc is below steady state level or some desired level and that any/output generated from Vcc cannot be relied upon. High voltage level converter 60a outputs 12 volts whenever LowVcc 38 is active, regardless of the state of the digital input to high voltage level converter 60a.

When the Vcc power supply outputs a steady state voltage level, typically 5 volts, LowVcc 38 will be inactive at 0 volts. The output of high voltage level converter 60 will then be determined by the state of the second input, a digital control signal generated from Vcc, $\overline{ERASE}$ 40, for example. The output of level converter 60a will be 0 volts when LowVcc is 0 volts and $\overline{ERASE}$ is active at 0 volts. Level converter 60 will output 12 volts while LowVcc 38 is inactive and $\overline{ERASE}$ 40 is inactive-logic high. Thus, each high voltage level converter 60 operates much like an OR gate. In contrast to an OR gate, level converter 60 takes one CMOS level input and a high voltage input and provides a high voltage output. The operation of level converter 60 is summarized in Table 1. Level converters 60b, 60c, and 60d operate in an identical fashion.

TABLE 1

| LowVcc | Digital Control Input | $H_{out}$ | $\overline{H_{out}}$ |
|---|---|---|---|
| Active (4–10 volts) | X | 12 volts | 0 volts |
| Inactive (0 volts) | 0 volts | 0 volts | 12 volts |
| Active (0 volts) | ~5 volts | 12 volts | 0 volts |

Thus, it will be understood from Table 1 that high voltage level contverter 60 performs an OR operation. In other words, whenever any input to level converter 60 is high, $H_{out}$ will be high. For this reason, high voltage level converters are represented symbolically in FIGS. 3A and 3B much like OR gates.

High voltage level converters 60 also provide a complementary output, $\overline{H_{out}}$. The operation of $\overline{H_{out}}$ is also summarized in Table 1.

Circuitry for controlling the voltages applied to memory array word lines by a row decoder is shown in FIG. 3B. The circuitry includes two high voltage level converters 60b and 60c and two switches 42 and 44, which generate the voltage levels to be applied to the memory array word lines. During power-up and power-down the circuitry shown will apply a safe voltage level, to the word lines by closing switch 42 and opening switch 44. Switch 42 outputs the Vcc level to the array word lines when memory contents are to be read. The operation of switch 42 is controlled by level converter 60b. Switch 42 outputs 5 volts while the output from level converter 60b is 12 volts. Switch 42 will be open when the output of level converter 60b is 0 volts. Given the response of level converter 60b to LowVcc, during power-up and power-down transitions switch 42 will output 5 volts to the array word lines. Thus, during power transitions safe voltage levels are applied to array word lines to guarantee data integrity.

During steady state operation of Vcc, read voltages can be applied to memory array word lines using the digital control input to level converter 60b, READ. Memory contents are read by bringing READ to a logic high. While READ is inactive low the output of level converter 60b will be 0 volts, which will turn switch 42 off. The voltages applied to the memory array word lines will then depend upon the state of switch 44.

Switch 44 applies 12 volts to the array word lines when memory cells are to be programmed. Switch 44 is controlled by the complementary output of level converter 60c. Twelve volts will be applied to the word lines when the output of level converter 60c is 12 volts. Given the response of level converter 60c to LowVcc, during power-up and power-down transitions switch 44 will be open. Put another way, switch 44 cannot apply 12 volts to the array word lines during power-up and power-down, thereby providing data integrity.

During steady state operation of Vcc, program voltages can be applied to memory array word lines using the digital control input to level converter 60c, $\overline{\text{PROGRAM}}$. Memory cells are programmed by bringing $\overline{\text{PROGRAM}}$ to a logic low, which turns switch 44 on and applies 12 volts to cell gates. While $\overline{\text{PROGRAM}}$ is inactive high the output of level converter 60c will be 0 volts, which turns switch 44 off. The voltages applied to the memory array word lines will then depend upon the state of switch 42.

Conceptually, circuitry for protecting array bit lines is similar to that used to protect array word lines. A high voltage level converter, or level converters, could be used to apply a safe voltage, to bit lines selectors during power-up and power-down.

A schematic diagram of one embodiment of a high voltage level converter 60 is shown in FIG. 4. Level converter 60 includes two cross coupled P-type transistors P1 62 and P2 64. The source of each transistor P1 62, P2 64 is tied to the programming power supply, Vpp 66. Outputs $H_{out}$ 68, and its complement, $\overline{H_{out}}$ 70, are taken off the drains of transistor P2 64 and P1 62, respectively. The drain of transistor P1 62 is also connected to the drain of N-type transistor N1 80. Similarly, the drain of transistor P2 64 is connected to the drain of N-type transistor N2 82. The sources of transistors N1 and N2 are connected to ground. The gates of transistors N1 and N2 are tied together via a NOR gate 84. A third N-type transistor N3 86 is connected between ground and the drain of P1. LowVcc input signal 90 is applied to the gate of N3 and to an input of NOR gate 84. The digital control input generated from Vcc is input to the gate of N1 and to an input of NOR gate 84. In FIG. 4, the digital control input shown is $\overline{\text{ERASE}}$ 92; however, any appropriate digital control signal can be used depending upon the particular type of cell protection level converter 60 is intended to help provide.

While the logic power supply Vcc is valid $\overline{\text{ERASE}}$ controls the operation of high voltage level converter 60. Consider the operation of level converter 60 while LowVcc is zero volts and $\overline{\text{ERASE}}$ is inactive at 5 volts. Table 1 indicates $H_{out}$ 68 should be 12 volts. Because LowVcc 90 is at 0 volts, a logic zero will be input to NOR gate 84. The output of NOR 84 is thus determined by the state of $\overline{\text{ERASE}}$, which is a logic high. NOR 84, thus outputs a logic low, zero volts, to the gate of transistor N2. N2 will not conduct given that its source is tied to ground. At 5.0 volts, $\overline{\text{ERASE}}$ 92 turns N1 ON, forcing $\overline{H_{out}}$ 70 to 0 volts and putting 0 volts on the gate of P2 64. In response to the voltage difference between its drain and source, P2 16 drives $H_{out}$ 68 to 12 volts. Thus, the operation of level converter 60 is consistent with both the prior circuit 10 and Table 1.

The operation of level converter 60 when LowVcc is zero volts and $\overline{\text{ERASE}}$ is 0 volts is also consistent with the prior circuit and Table 1; in other words, $H_{out}$ 68 will equal 0 volts. As before, because LowVcc is zero volts, and an input to NOR 84 is logic zero. The output of NOR 84 is a logic high because $\overline{\text{ERASE}}$ is a logic low. The high voltage on the gate of N2 82 turns it on and drives $H_{out}$ 68 to approximately zero volts. Due to the cross coupling between transistors P1 62 and P2 64, zero volts is placed on the gate of P1 64. P1 62 begins conducting, driving $\overline{H_{out}}$ 70 to 12 volts.

The difference between the prior circuit 10 and level converter 60 becomes apparent when the logic power supply Vcc is not fully valid, for example, during power-up and power-down transitions. In this situation, level converter 60 forces $H_{out}$ 68 to 12 volts. Assume LowVcc a high voltage, somewhere between 4 volts and 10 volts. During power transitions, the digital control input $\overline{\text{ERASE}}$ 92 should be inactive, but because the logic generating $\overline{\text{ERASE}}$ 92 is powered from Vcc this cannot be depended upon, so assume that $\overline{\text{ERASE}}$ 92 is zero volts. Because $\overline{\text{ERASE}}$ is low, the output of NOR gate 84 and the value of $H_{out}$ 68 will depend upon $\text{LowV}_{cc}$ 90. Given that LowVcc is 4-10 volts, NOR 84 outputs a logic low, regardless of the state of $\overline{\text{ERASE}}$. N2 82 will not conduct, therefore the value of $H_{out}$ 68 depends upon whether P2 64 conducts. LowVcc 90 turns N3 86 forcing $\overline{H_{out}}$ 70 to zero volts. Zero volts on the gate of P2 64 forces $H_{out}$ 68 to 12 volts, as desired.

A schematic diagram of an alternative embodiment of a high voltage level converter 60' can be seen in FIG. 5. Logically, this alternative embodiment functions identically to the embodiment of FIG. 4. The difference between the two embodiments is their ability to withstand high voltage levels from LowVcc for extended periods of time. The embodiment of FIG. 4 cannot withstand high voltage levels on the input to NOR gate 84 because such levels damage the oxide used in complementary metal-oxide semiconductor (CMOS) processes to fabricate gate 84. By eliminating the NOR gate and replacing it with an inverter and a transistor, the alternative embodiment is able to withstand a high voltage from LowVcc for extended periods of time and to perform the same logical function as the embodiment of FIG. 4.

The architecture of FIG. 5 resembles that of FIG. 4. High voltage level converter 60' includes two cross coupled P-type transistors P1 100 and P2 102. The source of each transistor P1 100, P2 102 is tied to the programming power supply, Vpp 104. Outputs Hout 106 and its complement, $H_{out}!$ 108, are taken off the drains of transistor P2 102 and P1 100, respectively. The drain of transistor P1 100 is also connected to the drain of N-type transistor N1 110. The drain of transistor P2 is coupled to the drain of N-type transistor N2 120 through another N-type transistor, N4 122. The drain and source of transistor 122 are connected between drain of transistor 102 and drain of transistor 120. An inverted version of LowVcc, $\overline{\text{LowVcc}}$ 121, is applied to the gate of N4 122. The sources of transistors N1 110 and N2 120 are connected to ground. The gates of transistors N1 110 and N2 120 are coupled together via an inverter 124. A third N-type transistor N3 126 is connected between ground and the drain of P1 100. LowVcc 128 is applied to the gate of N3 126. ERASE 130 is input to the gate of N1 110 and to inverter 124.

The logical operation of high voltage level converter 60' is the same as that of 60; however, the manner in which converter 60' prevents transistor N2 120 from driving $H_{out}$ 106 while Vcc is invalid is different. Consider the operation of level converter 60' when $\overline{\text{LowVcc}}$ 121 is zero volts; i.e. Vcc is invalid. This condition turns transistor 122 OFF, preventing N2 120 from driving $H_{out}$ 106. While Vcc is invalid transistor P2 102 determines the voltage level of $H_{out}$ because N4 122 is OFF. Thus, $H_{out}$ 106 is guaranteed to be 12 volts while Vcc is invalid.

Thus, a high voltage level converter intended to provide a high voltage output while a first power supply is invalid has been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. In a non-volatile semiconductor memory, circuitry for locking out a first control signal generated from a first power supply until said first power supply is at or above a first voltage level, comprising:

a. a first P-type transistor P1 having a gate, a drain and a source, said source of said P1 being coupled to a second power supply, said drain of said P1 being coupled to a first node, said gate of said P1 being coupled to a second node, said second node providing an output signal representative of said first control signal;

b. a first N-type transistor N1 having a gate, a drain and a source, said drain of said N1 being coupled to said first node, said source of said N1 being coupled to a third node, said gate of said N1 being coupled to said first control signal and to a fourth node;

c. a second P-type transistor P2 having a gate, a drain and a source, said source of said P2 being coupled to said second power supply, said gate of said P2 being coupled to said first node, said drain of said P2 being coupled to said second node;

d. a second N-type transistor N2 having a gate, a drain and a source, said drain of said N2 being coupled to said second node, said source of said N2 being coupled to said third node, said gate of said N2 being coupled to a sixth node;

e. a third N-type transistor N3 having a gate, a drain and a source, said drain of said N3 being coupled to said first node, said source of said N3 being coupled to said third node and said gate of said N3 being coupled to a fifth node; and f. means for preventing said transistor N2 from driving said second node until said first power supply is at or above said first voltage level, said means receiving as a first input said first control signal, said means having a second input coupled to said fifth node and a second control signal, said second control signal having a second voltage level indicative of the voltage level of said first power supply, said means generating a third control signal coupled to said sixth node.

2. The circuitry of claim 1 wherein said means comprises:

an inverting means having an input coupled to said fourth node and an output coupled to said sixth node; and a fourth N-type transistor N4 having a gate, a drain, and a source, said source of said N4 being connected to said drain of said N2, said drain of said N4 being connected to said drain of said P2, and said gate of said N4 being coupled to said fifth node.

3. The circuitry of claim 1 wherein said means comprises a NOR gate having a first input coupled to said fourth node and a second input coupled to said fifth node, said NOR gate having an output coupled to said sixth node.

4. The circuitry of claim 1 wherein said first voltage level is approximately 5 volts.

5. The circuitry of claim 4 wherein said first control voltage is within a range of approximately 0 volts to 5 volts.

6. The circuitry of claim 1 wherein said voltage level of said second power supply is approximately 12 volts.

7. The circuitry of claim 1 wherein said third node is ground.

8. The circuitry of claim 1 wherein said second voltage level is approximately 0 volts when said first power supply outputs said first voltage level and said second voltage level is above 0 volts when said first power supply outputs a voltage level below said first voltage level.

9. A circuit for preventing the erasure of a cell of a non-volatile semiconductor during a power-up or power-down transition, said cell having a drain, a gate and a source, wherein said cell is erased in response to a first control signal, said first control signal being generated from a first power supply having a steady state voltage level and outputting a first voltage level, comprising:

a. a first P-type transistor P1 having a gate, a drain and a source, said source of said P1 being coupled to a second power supply, said drain of said P1 being coupled to a first node, said gate of said P1 being coupled to a second node, said second node providing an output signal representative of said first control signal, said second node being coupled to said cell source;

b. a first N-type transistor N1 having a gate, a drain and a source, said drain of said N1 being coupled to said first node, said source of said N1 being coupled to a third node, said gate of said N1 being coupled to said first control signal and to a fourth node;

c. a second P-type transistor P2 having a gate, a drain and a source, said source of said P2 being coupled to said second power supply, said gate of said P2 being coupled to said first node, said drain of said P2 being coupled to said second node;

d. a second N-type transistor N2 having a gate, a drain and a source, said drain of said N2 being coupled to said second node, said source of said N2 being coupled to said third node, said gate of said N2 being coupled to a sixth node;

e. a third N-type transistor N3 having a gate, a drain and a source, said drain of said N3 being coupled to said first node, said source of said N3 being coupled to said third node and said gate of said N3 being coupled to a fifth node; and f. means for preventing said transistor N2 from driving said second node until said first power supply is below said first voltage level, said means receiving as a first input said first control signal, said means having a second input coupled to said fifth node and a second control signal, said second control signal having a second voltage level indicative of the voltage level of said first power supply, said means generating a third control signal coupled to said sixth node.

10. The circuitry of claim 9 wherein said steady state voltage level is approximately 5 volts.

11. The circuitry of claim 10 wherein said first control voltage is within a range of approximately 0 volts to 5 volts.

12. The circuitry of claim 10 wherein said third node is ground.

13. The circuitry of claim 10 wherein said second voltage level is approximately 0 volts when said first power supply outputs said steady state voltage level and said second voltage level is above 0 volts when said first power supply outputs a voltage level below said steady state voltage level.

14. The circuitry of claim 9 wherein said voltage level of said second power supply is approximately 12 volts.

15. The circuitry of claim 9 wherein said means comprises:

an inverting means having an output coupled to said sixth node and an input coupled to said fourth node; and a fourth N-type transistor N4 having a gate, a drain, and a source, said source of said N4 being connected to said drain of said N2, said drain of said N4 being connected to said drain of said P2, and said gate of said N4 being coupled to said fifth node.

16. The circuitry of claim 9 wherein said means comprises a NOR gate having a first input coupled to said fourth node and a second input coupled to said fifth node, said NOR gate having an output coupled to said sixth node.

17. In a non-volatile semiconductor memory, circuitry for locking out a first control signal generated from a first power supply until said first power supply is at or above a first voltage level, comprising:

a. a first P-type transistor P1 having a gate, a drain and a source, said source of said P1 being coupled to a second power supply, said drain of said P1 being coupled to a first node, said gate of said P1 being coupled to a second node, said second node providing an output signal representative of said first control signal;

b. a first N-type transistor N1 having a gate, a drain and a source, said drain of said N1 being coupled to said first node, said source of said N1 being coupled to a third node, said gate of said N1 being coupled to said first control signal and to a fourth node;

c. a NOR gate having a first input coupled to said fourth node and having a second input coupled to a fifth node and to a second control signal, said second control signal having a second voltage level indicative of the voltage level of said first power supply, said NOR gate having an output coupled to a sixth node;

d. a second P-type transistor P2 having a gate, a drain and a source, said source of said P2 being coupled to said second power supply, said gate of said P2 being coupled to said first node, said drain of said P2 being coupled to said second node;

e. a second N-type transistor N2 having a gate, a drain and a source, said drain of said N2 being coupled to said second node, said source of said N2 being coupled to said third node, said gate of said N2 being coupled to said sixth node; and f. a third N-type transistor N3 having a gate, a drain and a source, said drain of said N3 being coupled to said first node, said source of said N3 being coupled to said third node and said gate of said N3 being coupled to said fifth node.

18. In a non-volatile semiconductor memory, circuitry for locking out a first control signal generated from a first power supply until said first power supply is at or above a first voltage level, comprising:

a. a first P-type transistor P1 having a gate, a drain and a source, said source of said P1 being coupled to a second power supply, said drain of said P1 being coupled to a first node, said gate of said P1 being coupled to a second node, said second node providing an output signal representative of said first control signal;

b. a first N-type transistor N1 having a gate, a drain and a source, said drain of said N1 being coupled to said first node, said source of said N1 being coupled to a third node, said gate of said N1 being coupled to said first control signal and to a fourth node;

c. a second P-type transistor P2 having a gate, a drain and a source, said source of said P2 being coupled to said second power supply, said gate of said P2 being coupled to said first node, said drain of said P2 being coupled to said second node;

d. a second N-type transistor N2 having a gate, a drain and a source, said drain of said N2 being coupled to said second node, said source of said N2 being coupled to said third node, said gate of said N2 being coupled to a fifth node;

e. a third N-type transistor N3 having a gate, a drain and a source, said drain of said N3 being coupled to said first node, said source of said N3 being coupled to said third node and said gate of said N3 being coupled to a second control signal having a second voltage level indicative of the first power supply;

f. an inverting means having an input coupled to said fourth node and said first control signal, said inverting means having an output coupled to said fifth node; and g. a fourth N-type transistor N4 having a gate, a drain, and a source, said source of said N4 being connected to said drain of said N2, said drain of said N4 being connected to said drain of said P2, and said gate of said N4 being coupled to said second control signal.

* * * * *

UNITED STATES PATENT AND TRADEMARK OFFICE
CERTIFICATE OF CORRECTION

| | | |
|---|---|---|
| PATENT NO. | : | 5,301,151 |
| DATED | : | April 5, 1994 |
| INVENTOR(S) | : | Wells et al. |

It is certified that error appears in the above-identified patent and that said Letters Patent is hereby corrected as shown below:

In column 9 at line 4 delete "until" and insert --while--

Signed and Sealed this

Twenty-second Day of July, 1997

Attest:

*Attesting Officer*

BRUCE LEHMAN

*Commissioner of Patents and Trademarks*